US012310264B2

United States Patent
Ok et al.

(10) Patent No.: US 12,310,264 B2
(45) Date of Patent: May 20, 2025

(54) PHASE CHANGE MEMORY USING MULTIPLE PHASE CHANGE LAYERS AND MULTIPLE HEAT CONDUCTORS

(71) Applicant: INTERNATIONAL BUSINESS MACHINES CORPORATION, Armonk, NY (US)

(72) Inventors: Injo Ok, Loudonville, NY (US); Balasubramanian Pranatharthiharan, Santa Clara, CA (US); Kevin W. Brew, Niskayuna, NY (US); Wei Wang, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 446 days.

(21) Appl. No.: 17/548,745

(22) Filed: Dec. 13, 2021

(65) Prior Publication Data

US 2022/0102627 A1    Mar. 31, 2022

Related U.S. Application Data

(62) Division of application No. 16/438,906, filed on Jun. 12, 2019, now Pat. No. 11,271,151.

(51) Int. Cl.
   *H10N 70/20*   (2023.01)
   *G11C 13/00*   (2006.01)
   *H10N 70/00*   (2023.01)

(52) U.S. Cl.
   CPC ......... *H10N 70/231* (2023.02); *H10N 70/021* (2023.02); *H10N 70/063* (2023.02);
   (Continued)

(58) Field of Classification Search
   CPC ............... H01L 45/1683; H01L 45/144; H01L 45/1286; H10N 70/066; H10N 70/8828; H10N 70/8613
   See application file for complete search history.

(56) References Cited

U.S. PATENT DOCUMENTS

| 5,825,046 A | 10/1998 | Czubatyj et al. |
| 7,324,365 B2 | 1/2008 | Gruening-von Schwerin et al. |
| (Continued) |

FOREIGN PATENT DOCUMENTS

CN    105336851 B    10/2015

OTHER PUBLICATIONS

List of IBM Patents or Patent Applications Treated as Related dated Dec. 13, 2021, 2 pages.

(Continued)

*Primary Examiner* — Aaron J Gray
(74) *Attorney, Agent, or Firm* — Tutunjian & Bitetto, P.C.; Robert Richard Aragona

(57) ABSTRACT

A method is presented for reducing a reset current for a phase change memory (PCM). The method includes forming a bottom electrode, constructing a PCM cell structure including a plurality of phase change memory layers and a plurality of heat transfer layers, wherein the plurality of phase change memory layers are assembled in an alternating configuration with respect to the plurality of heat transfer layers, and forming a top electrode over the PCM cell structure. The plurality of phase change memory layers are arranged perpendicular to the top and bottom electrodes. Additionally, airgaps are defined adjacent the PCM cell structure.

10 Claims, 9 Drawing Sheets

(52) U.S. Cl.
CPC ......... *H10N 70/066* (2023.02); *H10N 70/826* (2023.02); *H10N 70/841* (2023.02); *H10N 70/8613* (2023.02); *H10N 70/8828* (2023.02); *G11C 13/0004* (2013.01); *G11C 13/0097* (2013.01)

(56) References Cited

U.S. PATENT DOCUMENTS

| | | |
|---|---|---|
| 7,348,620 B2 | 3/2008 | Chiang et al. |
| 7,422,926 B2 | 9/2008 | Pellizzer et al. |
| 7,989,920 B2 | 8/2011 | Lee et al. |
| 8,236,685 B2 | 8/2012 | Park |
| 8,399,285 B2 | 3/2013 | Chang |
| 8,462,545 B2 | 6/2013 | Dennison et al. |
| 8,699,267 B2 | 4/2014 | Dennison et al. |
| 9,825,097 B2 | 11/2017 | Masuoka et al. |
| 2007/0012956 A1 | 1/2007 | Gutsche et al. |
| 2008/0298114 A1* | 12/2008 | Liu ................ H10N 70/043 257/E21.536 |
| 2009/0184304 A1 | 7/2009 | Chang et al. |
| 2014/0054537 A1* | 2/2014 | Lee ................ H10N 70/011 257/4 |
| 2014/0198565 A1* | 7/2014 | Pellizzer ............ H10N 70/8828 365/163 |
| 2016/0149125 A1* | 5/2016 | Oh ................ H10N 70/826 257/4 |

OTHER PUBLICATIONS

Chien et al., "Reliability Study of a 128Mb Phase Change Memory Chip Implemented with Doped Ga—Sb—Ge with Extraordinary Thermal Stability", 2016 IEEE International Electron Devices Meeting. Dec. 3, 2016. pp. 1-4.

Kim et al., "One-Dimensional Thickness Scaling Study of Phase Change Material (Ge2Sb2Te5) Using a Pseudo 3-2 Terminal Device", IEEE Transactions on Electron Devices. vol. 58, No. 5. May 2011. pp. 1483-1489.

* cited by examiner

PHASE CHANGE MEMORY USING MULTIPLE PHASE CHANGE LAYERS AND MULTIPLE HEAT CONDUCTORS

BACKGROUND

The present invention relates generally to semiconductor devices, and more specifically, to a phase change memory (PCM) cell employing multiple phase change layers and multiple heat conductors in an alternating configuration.

A phase-change memory (PCM) is one of next-generation nonvolatile memory devices that are expected to meet an increasing demand for a high-performance and low-power semiconductor memory device. In PCM devices, data can be stored or erased by heating or cooling a phase-change layer therein. However, there can be thermal interference between adjacent memory cells.

SUMMARY

In accordance with an embodiment, a method is provided for reducing a reset current for a phase change memory (PCM). The method includes forming a bottom electrode, constructing a PCM cell structure including a plurality of phase change memory layers and a plurality of heat transfer layers, wherein the plurality of phase change memory layers are assembled in an alternating configuration with respect to the plurality of heat transfer layers, and forming a top electrode over the PCM cell structure.

In accordance with another embodiment, a method is provided for reducing a reset current for a phase change memory (PCM). The method includes forming a bottom electrode, constructing a PCM cell stack over the bottom electrode, the PCM cell stack including a plurality of phase change memory layers separated from each other by heat transfer layers, and forming a top electrode over the PCM cell stack.

In accordance with yet another embodiment, a semiconductor device is provided for reducing a reset current for a phase change memory (PCM). The semiconductor device includes a bottom electrode, a PCM cell structure disposed over the bottom electrode, the PCM cell structure including a plurality of phase change memory layers and a plurality of heat transfer layers, wherein the plurality of phase change memory layers are assembled in an alternating configuration with respect to the plurality of heat transfer layers, and a top electrode disposed over the PCM cell structure.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
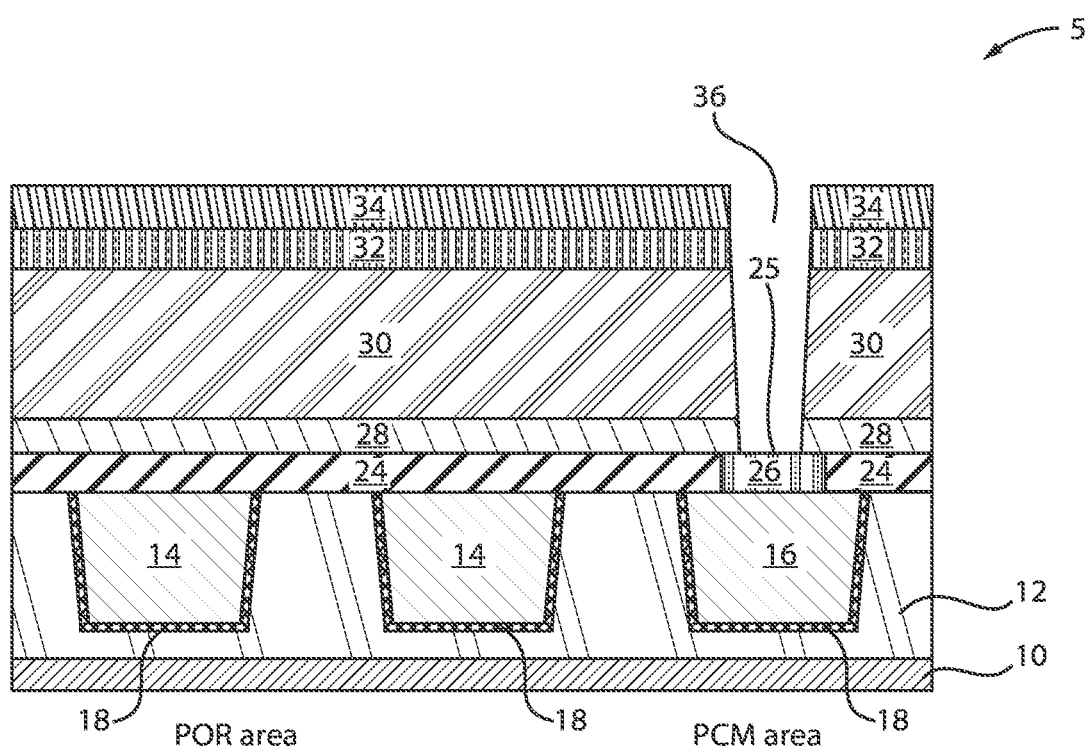
FIG. 1 is a cross-sectional view of a semiconductor structure including a plurality of conductive lines formed within a dielectric layer, a bottom electrode formed over at least one conductive line, and sacrificial layers formed thereon, in accordance with an embodiment of the present invention.

Embodiments in accordance with the present invention provide methods and devices for constructing a phase change memory structure or phase change memory (PCM) cell having a plurality of PCM materials and a plurality of heat transfer liners. The PCM materials and the heat transfer liners can be assembled in an alternating configuration. The PCM materials can include a Ge—Sb—Te (germanium-antimony-tellurium or "GST") alloy and the heat transfer liners can include a metal or metal alloys. The PCM cell can also be referred to as a pillar GST cell or a mushroom GST cell. The PCM cell provides for a PCM structure that makes the SET status more stable. Additionally, airgaps around or adjacent the PCM cell help improve heat efficiency. In a first embodiment, airgaps are defined adjacent multi-vertical phase change layers with a higher resistivity metal or oxide.

In a second embodiment, a projection liner is disposed adjacent a stacked multi-phase change material to provide for better resistance stability.

Embodiments in accordance with the present invention provide methods and devices for employing phase change based materials in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of conductive lines formed within a dielectric layer, a bottom electrode formed over at least one conductive line, and sacrificial layers formed thereon, in accordance with an embodiment of the present invention.

A semiconductor structure 5 includes a plurality of conductive lines 14, 16 formed within trenches of an inter-layer dielectric (ILD) 12. The ILD 12 can be formed over a substrate 10. A conductive fill material or liner 18 can be formed or deposited around each of the trenches.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 12 can include any materials known in the art, such as, for example, porous silicates, carbon doped oxides, silicon dioxides, silicon nitrides, silicon oxynitrides, or other dielectric materials. The ILD 12 can be formed using any method known in the art, such as, for example, chemical vapor deposition, plasma enhanced chemical vapor deposition, atomic layer deposition, or physical vapor deposition. The ILD 12 can have a thickness ranging from about 25 nm to about 200 nm.

The dielectric material of layer 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 14, 16 can be formed in the openings or trenches formed in the ILD 12. The metal lines 14, 16 can be any conductive materials known in the art, such as, for example, copper (Cu), aluminum (Al), or tungsten (W). The metal lines 14, 16 can be fabricated using any technique known in the art, such as, for example, a single or dual damascene technique. In an embodiment, the metal lines 14, 16 can be copper (Cu) and can include a metal liner 18, where the metal liner 18 can be metals, such as, for example, tantalum nitride and tantalum (TaN/Ta), titanium, titanium nitride, cobalt, ruthenium, and manganese.

In one example, the liner 18 can be a tantalum nitride (TaN) liner or in the alternative a tantalum (Ta) liner. In one example embodiment, the conductive fill material 18 can be deposited, for example, by electroplating, electroless plating, chemical vapor deposition (CVD), atomic layer deposition (ALD) and/or physical vapor deposition (PVD).

A dielectric layer 24, a bottom electrode 26, an optional NBLOK layer 28, a TEOS (tetraethyl orthosilicate, Si(OC$_2$H$_5$)$_4$) hard mask layer 30, a first sacrificial layer 32, and a second sacrificial layer 34 can be formed over the conductive lines 14, 16. An opening 36 is formed in the TEOS layer 30, the first sacrificial layer 32, and the second sacrificial layer 34, the opening 36 exposing a top surface 25 of the bottom electrode 26.

The dielectric material of layer 24 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4. The dielectric layer 24 can have a thickness of about 20 nm.

The bottom electrode 26 can be, e.g., formed from Ta, Ti/TiN, W, WN, TaN, polysilicon, doped polysilicon, amorphous silicon, doped amorphous silicon, or any other suitable material, or any other conductive material. Alternatively, the bottom electrode 26 can be, e.g., any suitable conductive material or materials, e.g., Ag, Al, Cu, Ta, TaN, Ti, TiN, Al, W or any other suitable material, and can be deposited or formed in any suitable manner. The bottom electrode 26 can have a width of about 36 nm to about 56 nm, and can preferably be TaN.

NBLOK layer 28, is engineered as an alternative to silicon nitride films. NBLOK layer 28 is designed to reduce the dielectric constant (k) of copper damascene structures in order to achieve faster, more powerful devices. With a dielectric constant of less than 5, the NBLOK offers up to twice the etch selectivity of SiN, demonstrates leakage that is six to seven orders of magnitude better than conventional silicon carbide (SiC) material, and features good adhesion to other films. The thickness of the NBLOK layer 28 can be, e.g., about 30 nm. The NBLOK layer 28 can be optional.

In various embodiments, the layer 30 can be, e.g., a low-k dielectric layer. A low-k dielectric material as used in the low-k dielectric layer 30 can have a dielectric constant that is less than 4.0, e.g., 3.9. In one embodiment, the low-k material layer 30 can have a dielectric constant ranging from about 1.0 to about 3.5. In another embodiment, the low-k material layer 30 can have a dielectric constant ranging from about 1.75 to about 3.2.

One example of a material suitable for the low-k materials for the low-k dielectric layer 30 can include silicon oxycarbonitride (SiOCN). Other low-k materials that can also be used for the low-k material layer 30 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 30 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 30 can have a thickness ranging from about 100 nm to about 120 nm.

The first and second sacrificial layers or hardmask layers 32, 34 can be a nitride, for example, a silicon nitride (SiN), an oxynitride, for example, silicon oxynitride (SiON), or a combination thereof. In a preferred embodiment, the hardmask layer 32 can be silicon nitride (SiN), for example, Si$_3$N$_4$ and the hardmask layer 34 can be titanium nitride (TiN).

In one or more embodiments, the hardmask layers 32, 34 can each have a thickness in the range of about 20 nm to about 100 nm, or in the range of about 25 nm to about 75 nm, or in the range of about 45 nm to about 55 nm, although other thicknesses are contemplated. In one example, the hardmask layer 32 has a thickness of about 25 nm and the hardmask layer 34 has a thickness of about 25 nm.

Figure 2:
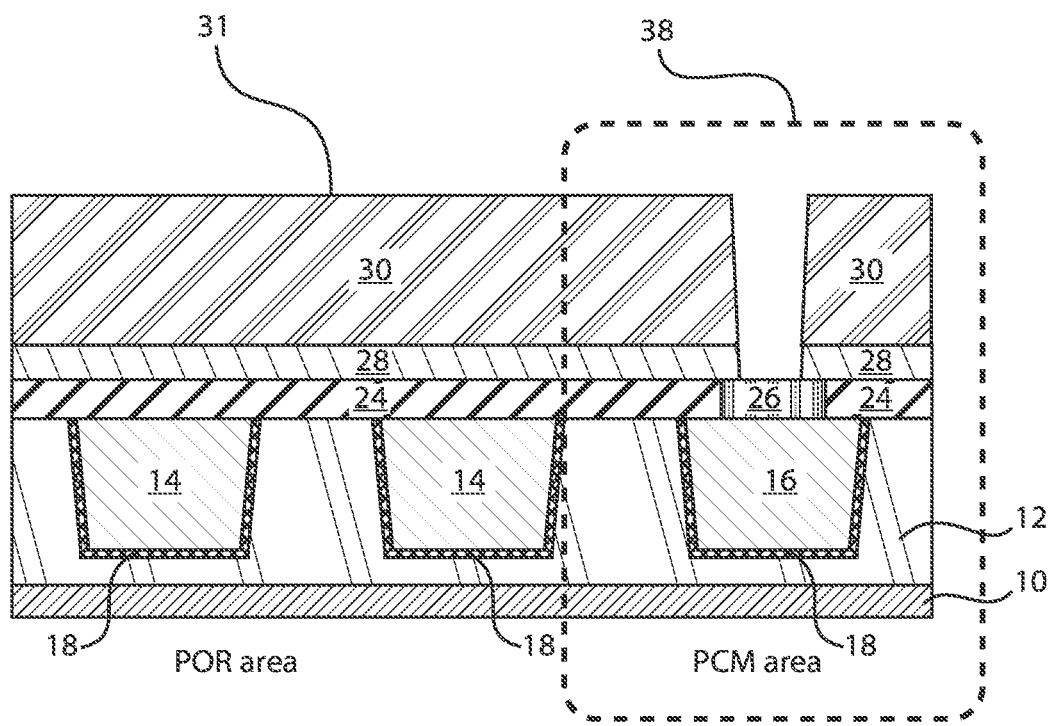
FIG. 2 is a cross-sectional view of the semiconductor structure of FIG. 1 where the sacrificial layers are removed, in accordance with an embodiment of the present invention.

FIG. 2 is a cross-sectional view of the semiconductor structure of FIG. 1 where the sacrificial layers are removed, in accordance with an embodiment of the present invention.

In various exemplary embodiments, the first and second sacrificial layers 32, 34 are removed. Removal of the first and second sacrificial layers 32, 34 results in exposure of a top surface 31 of the TEOS layer or low-k dielectric layer 30. The rest of the FIGS. focus on the PCM area 38.

Figure 3:
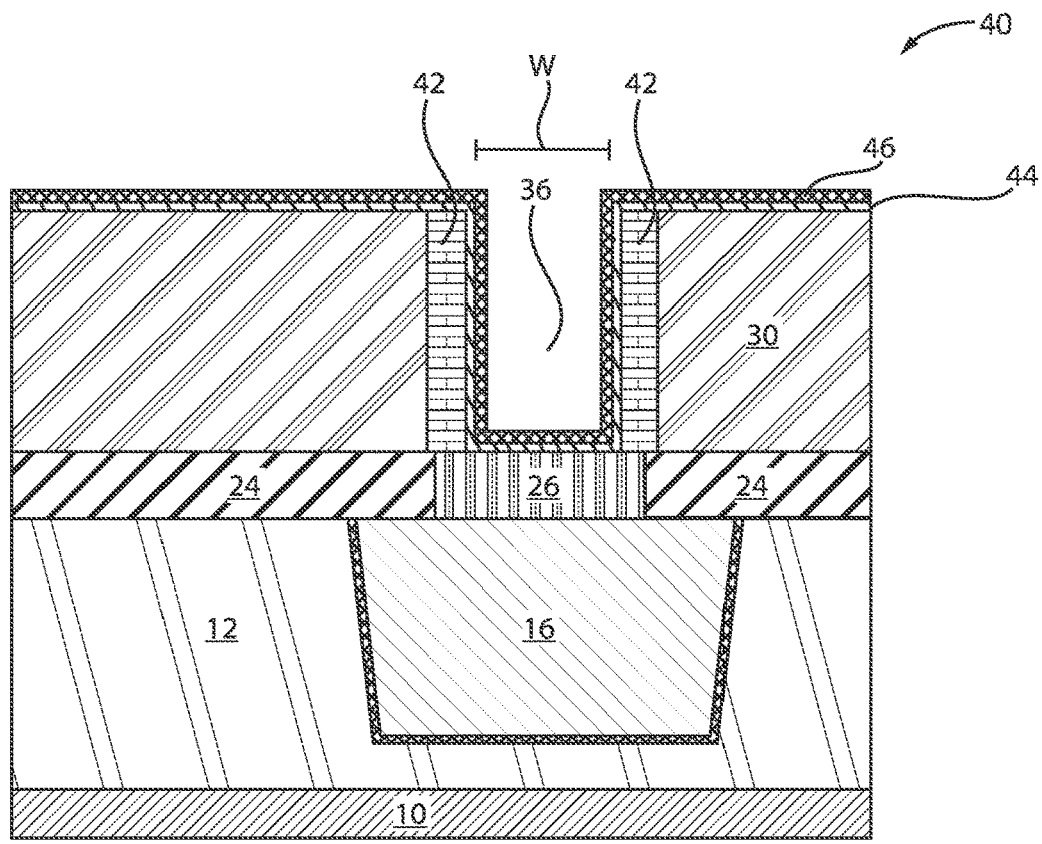
FIG. 3 is a cross-sectional view of the semiconductor structure of FIG. 2 where sacrificial spacers are formed, a first metal liner and a first phase change material are deposited, and the first phase change material is etched, in accordance with an embodiment of the present invention.
Figure 3:
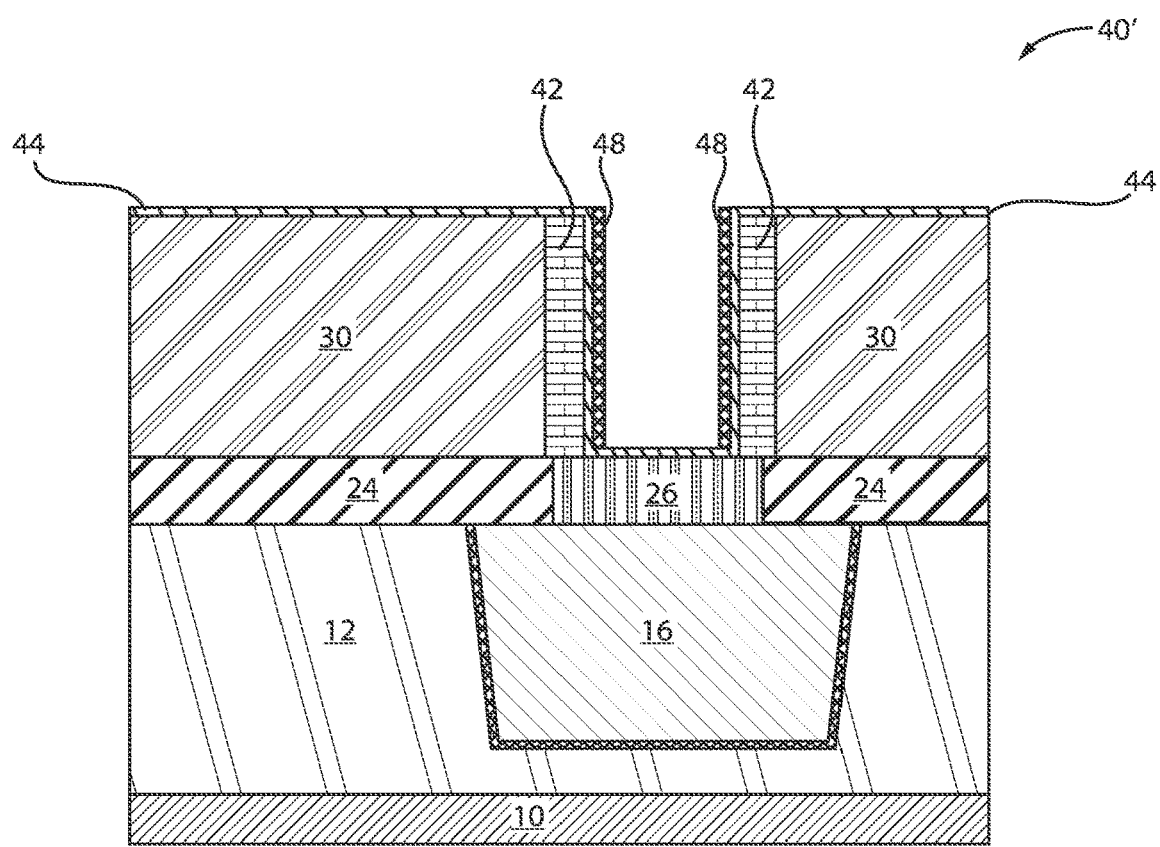

FIG. 3 is a cross-sectional view of the semiconductor structure of FIG. 2 where sacrificial spacers are formed, a first metal liner and a first phase change material are deposited, and the first phase change material is etched, in accordance with an embodiment of the present invention.

In various exemplary embodiments, in structure 40, sacrificial spacers 42 are formed within the opening 36 and adjacent the low-k dielectric layer 30. A first metal liner (or heat transfer layer) 44 is deposited followed by a first phase change material 46. The width "W" of the opening 36 can be, e.g., about 80 nm. Moreover, the NBLOK layer is not shown and the dielectric layer 24 can have a thickness of about 35 nm.

In various exemplary embodiments, in structure 40', the first phase change material 46 is etched such that first phase change material portions 48 remain adjacent the sacrificial spacers 42. The first phase change material portions 48 are perpendicular to the bottom electrode 26. The first phase change material portions 48 are vertically aligned with respect to the bottom electrode 26 and the conductive line 16. The first phase change material portions 48 are parallel to the sacrificial spacers 42.

Spacers 42 can include a low-k dielectric formed according to known processes. Exemplary low k dielectric materials include, but are not limited to, dielectric nitrides (e.g., silicon nitride, SiBCN), dielectric oxynitrides (e.g., SiOCN), or any combination thereof or the like.

Phase change material 46 can be changed from one phase state to another by application of electrical pulses. A shorter, higher amplitude pulse tends to change the phase change material 46 to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state.

The phase change material 46 can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

In the present example, the phase change material layer 46 preferably includes a Ge—Sb—Te (germanium-antimony-tellurium or "GST") alloy. Alternatively, other suitable materials for the phase change material layer 46 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

The metal liner (or heat transfer layer) 44 can include, e.g., copper (Cu), cobalt (Co), aluminum (Al), platinum (Pt), gold (Au), tungsten (W), titanium (Ti), or any combination thereof. The metal can be deposited by a suitable deposition process, for example, CVD, PECVD, PVD, plating, thermal or e-beam evaporation, or sputtering.

Figure 4:
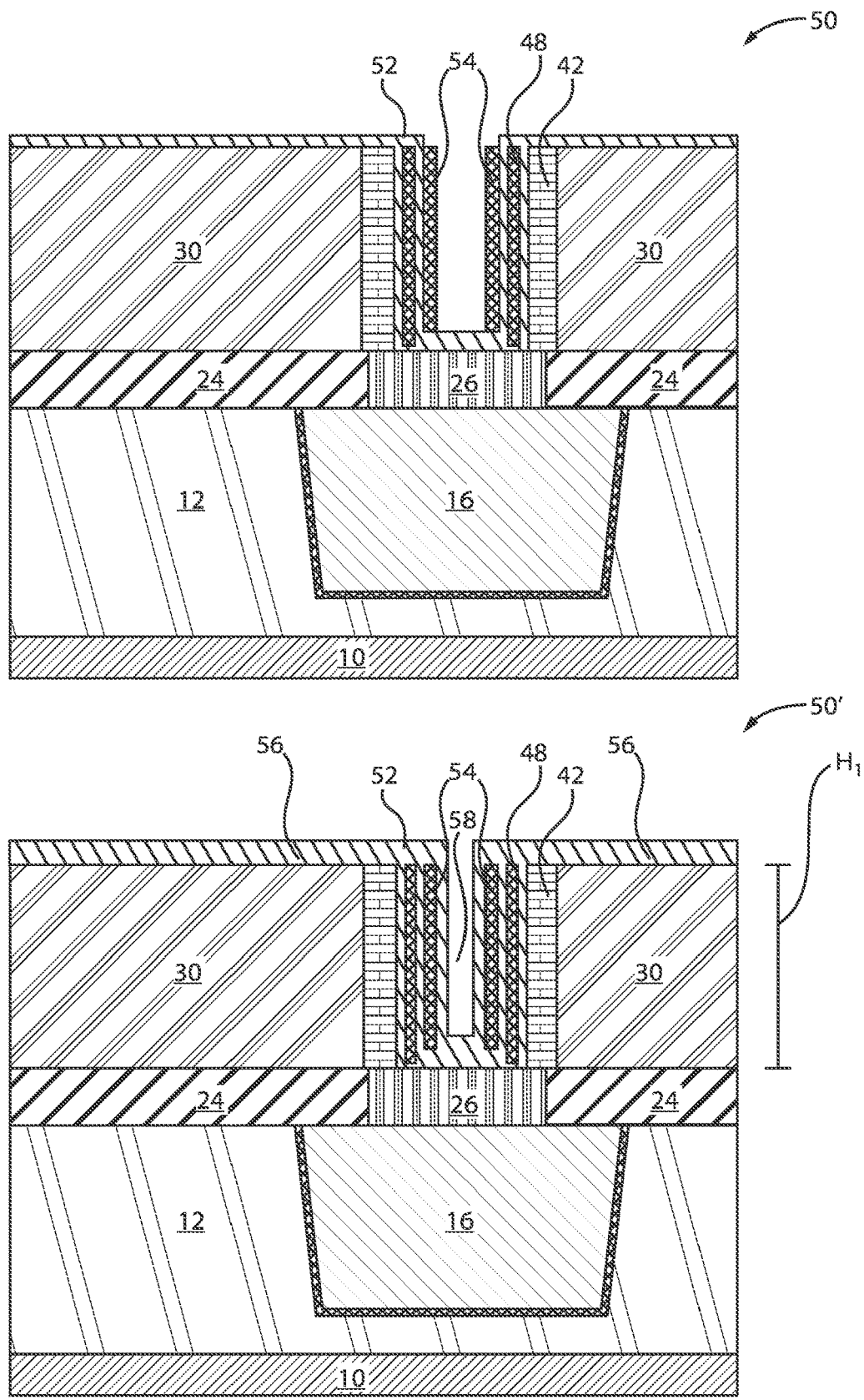
FIG. 4 is a cross-sectional view of the semiconductor structure of FIG. 3 where a second metal liner and a second phase change material are deposited, the second phase change material is etched, and a third metal liner is subsequently deposited, in accordance with an embodiment of the present invention.

FIG. 4 is a cross-sectional view of the semiconductor structure of FIG. 3 where a second metal liner and a second phase change material are deposited, the second phase change material is etched, and a third metal liner is subsequently deposited, in accordance with an embodiment of the present invention.

In various exemplary embodiments, in structure 50, a second metal liner (or heat transfer layer) 52 and a second phase change material 54 are deposited. The phase change material 54 is etched to form phase change material portions 54 adjacent the second metal liner 52. The spacers 54 are formed within the opening.

In various exemplary embodiments, in structure 50', a third metal liner (or heat transfer layer) 56 is deposited. An opening 58 is defined within the third metal liner 56. Thus, an alternating configuration of phase change material layers and metal liners is formed. This phase change memory structure or PCM cell can have a height of Hi. The phase change memory structure is aligned with the bottom electrode 26. The second phase change material portions 54 are perpendicular to the bottom electrode 26. The second phase change material portions 54 are vertically aligned with respect to the bottom electrode 26 and the conductive line 16. The second phase change material portions 54 are parallel to the sacrificial spacers 42 and to the first phase change material portions 48. The first phase change material portions 48 can have a length greater than the length of the second phase change material portions 54.

Figure 5:
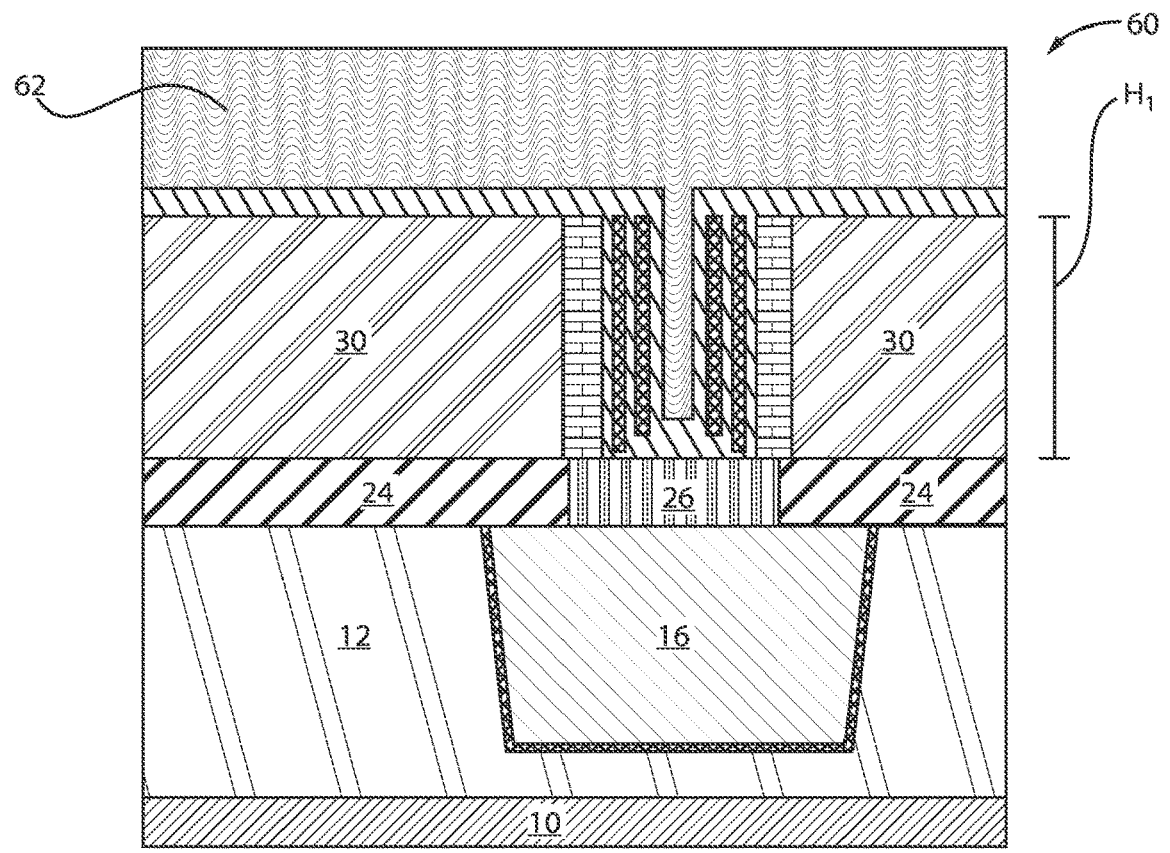
FIG. 5 is a cross-sectional view of the semiconductor structure of FIG. 4 where a dielectric material is deposited, etched, and reduced by chemical-mechanical polishing (CMP), in accordance with an embodiment of the present invention.
Figure 5:
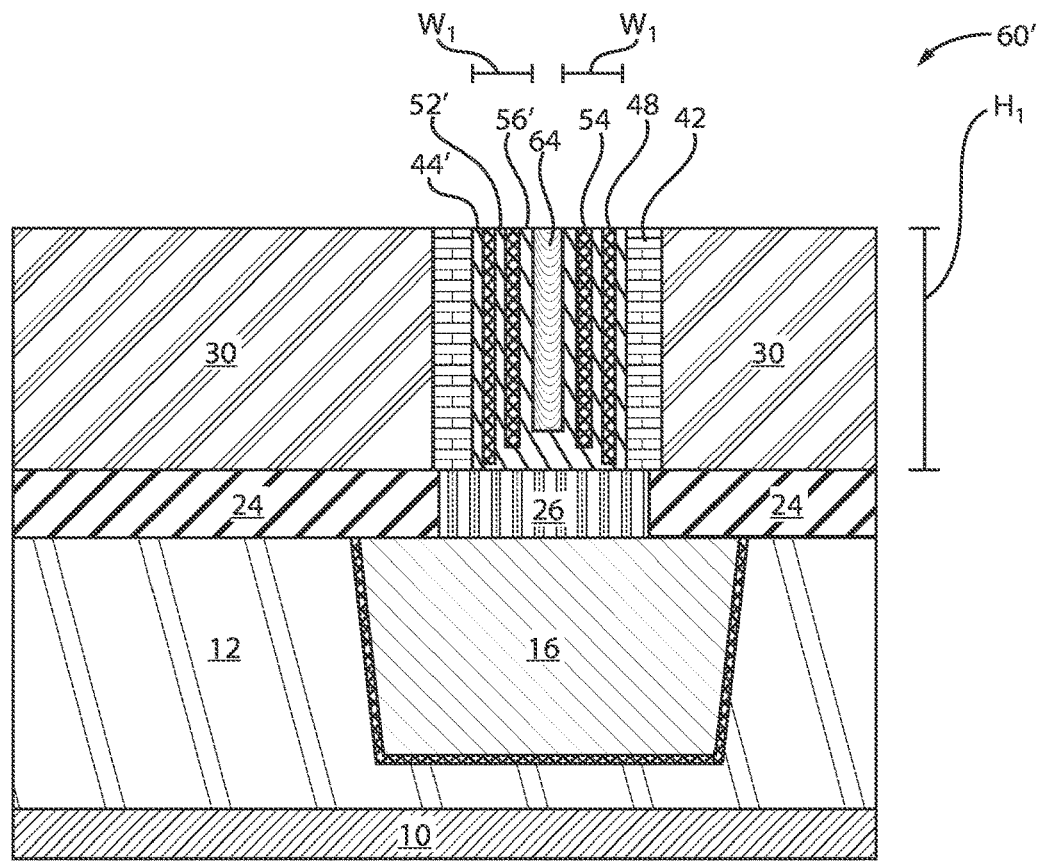

FIG. 5 is a cross-sectional view of the semiconductor structure of FIG. 4 where a dielectric material is deposited, etched, and reduced by chemical-mechanical polishing (CMP), in accordance with an embodiment of the present invention.

In various exemplary embodiments, in structure 60, a dielectric material 62 is deposited. The dielectric material 62 can be, e.g., a low-k dielectric layer. One example of a material suitable for the low-k materials for the low-k dielectric layer 62 can include silicon oxycarbonitride (SiOCN). Other low-k materials that can also be used for the low-k dielectric layer 62 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 62 can be conformally deposited using CVD. Variations of CVD processes suitable for forming the first dielectric layer include, but are not limited to, APCVD, LPCVD and PECVD, MOCVD and combinations thereof can also be employed.

In various exemplary embodiments, in structure 60', the dielectric material 62 is etched such that a dielectric region 64 remains within the third metal liner 56'. Thus, the phase change memory structure or PCM cell includes a pair of first phase change material portions 48 and a pair of second phase change material portions 54. The pair of first phase change material portions 48 have a length greater than the length of the pair of second phase change material portions 54. The pair of first phase change material portions 48 are confined between the first metal liner 44' and the second metal liner 52'. The pair of second phase change material portions 54 are confined between the second metal liner 52' and the third metal liner 56'.

The phase change memory structure can have a substantially U-shaped configuration, with a dielectric region 64 defined or incorporated therein. The height "Hi" of the phase change memory structure can be about 50 nm to about 80 nm. The width "Wi" of each leg or pillar of the U-shaped configuration can be about 25 nm. The width of the dielectric region 64 can be about 30 nm to about 50 nm.

The width of the first metal liner can be, e.g., about 3 nm to about 5 nm. Similarly, the width of the second metal liner and the third metal liner can be e.g., about 3 nm to about 5 nm.

The width of the first phase change material can be, e.g., about 3 nm to about 5 nm. Similarly, the width of the second phase change material can be, e.g., about 3 nm to about 5 nm.

Thus, the width of the heat transfer layers can be approximately equal to the width of the phase change material layers.

Figure 6:
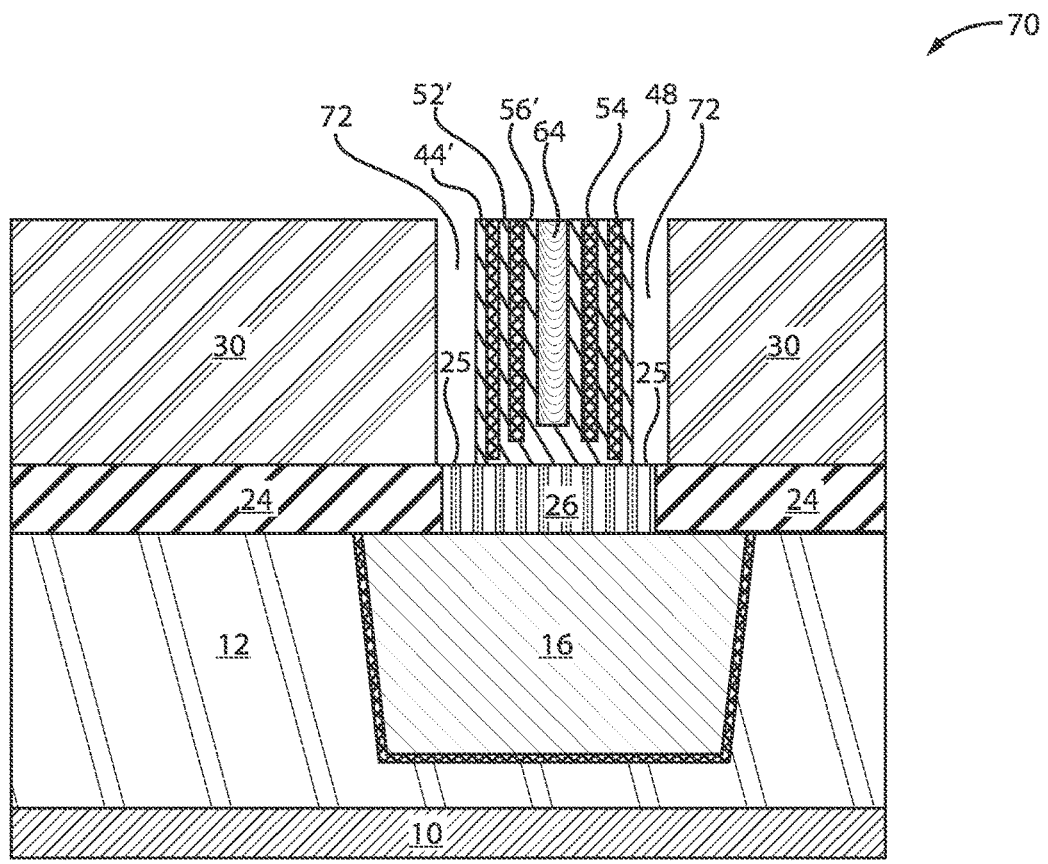
FIG. 6 is a cross-sectional view of the semiconductor structure of FIG. 5 where the sacrificial spacers are removed to form airgaps, and a top electrode is deposited, in accordance with an embodiment of the present invention.
Figure 6:
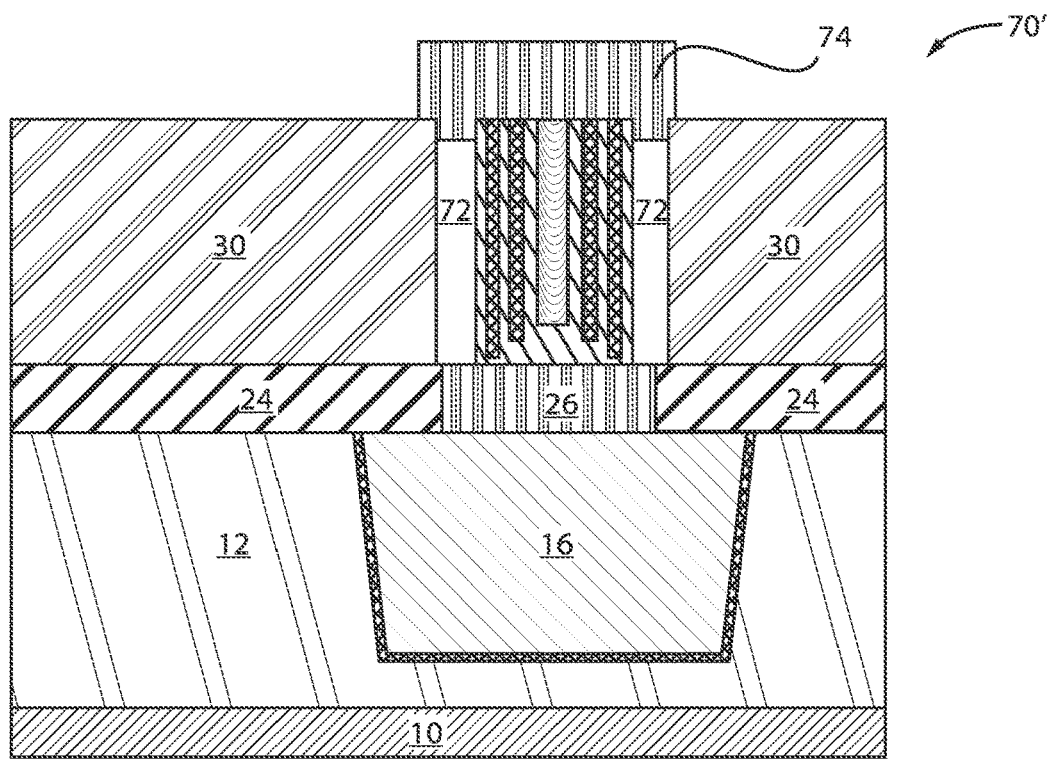

FIG. 6 is a cross-sectional view of the semiconductor structure of FIG. 5 where the sacrificial spacers are removed to form airgaps, and a top electrode is deposited, in accordance with an embodiment of the present invention.

In various exemplary embodiments, in structure 70, the sacrificial spacers 42 are removed to create or define airgaps 72. The removal of the sacrificial spacers 42 results in exposure of portions of the top surface 25 of the bottom electrode 26.

In various exemplary embodiments, in structure 70', a top electrode 74 is deposited. The top electrode 74 encloses the airgaps 72. Stated differently, the top electrode 74 defines the boundary of the airgaps 72.

The top electrode 74 can be, e.g., formed from Ta, Ti/TiN, W, WN, TaN, polysilicon, doped polysilicon, amorphous silicon, doped amorphous silicon, or any other suitable material, or any other conductive material. Alternatively, the top electrode 74 can be, e.g., any suitable conductive material or materials, e.g., Ag, Al, Cu, Ta, TaN, Ti, TiN, Al, W or any other suitable material, and can be deposited or formed in any suitable manner.

Structure 70' is the final structure where the phase change material structure (or PCM cell) including alternating layers of phase change materials and heat conductors is confined between the bottom electrode 26 and the top electrode 74.

Airgaps 72 are present between the bottom electrode 26 and the top electrode 74 (vertical confinement) and are present between the low-k dielectric layer 30 and the first metal liner 44' (horizontal confinement). The metal liners provide for efficient heat transfer to the phase change materials. The airgaps 72 around the PCM cell improve heat efficiency. PCM cell control can be stabilized by employing multiple metal liners in combination with multiple phase change materials, such as GST.

Therefore, a PCM cell structure is constructed including a plurality of phase change memory layers 48, 54 and a plurality of heat transfer layers 44', 52', 56', the plurality of phase change memory layers 48, 54 assembled in an alternating configuration with respect to the plurality of heat transfer layers 44', 52', 56'. The plurality of phase change memory layers 48, 54 are arranged perpendicular to the top and bottom electrodes 74, 26. Airgaps 74 are defined adjacent the PCM cell structure. The airgaps 74 extend from the top electrode 74 to the bottom electrode 26. The PCM cell structure defines a substantially U-shaped configuration, where an oxide material 64 is disposed within the U-shaped configuration. Moreover, in one example, a pair of phase change memory layers are formed on one side of the oxide material 64 and another pair of phase change memory layers are formed on an opposed side of the oxide material 64. Of course, one skilled in the art can contemplate a number of different phase change memory layers and a number of different heat transfer layers. Also, the plurality of phase change memory layers 48, 54 can have different lengths. In one instance, phase change memory layer 48 is longer or has a greater length than the phase change memory layer 54.

Figure 7:
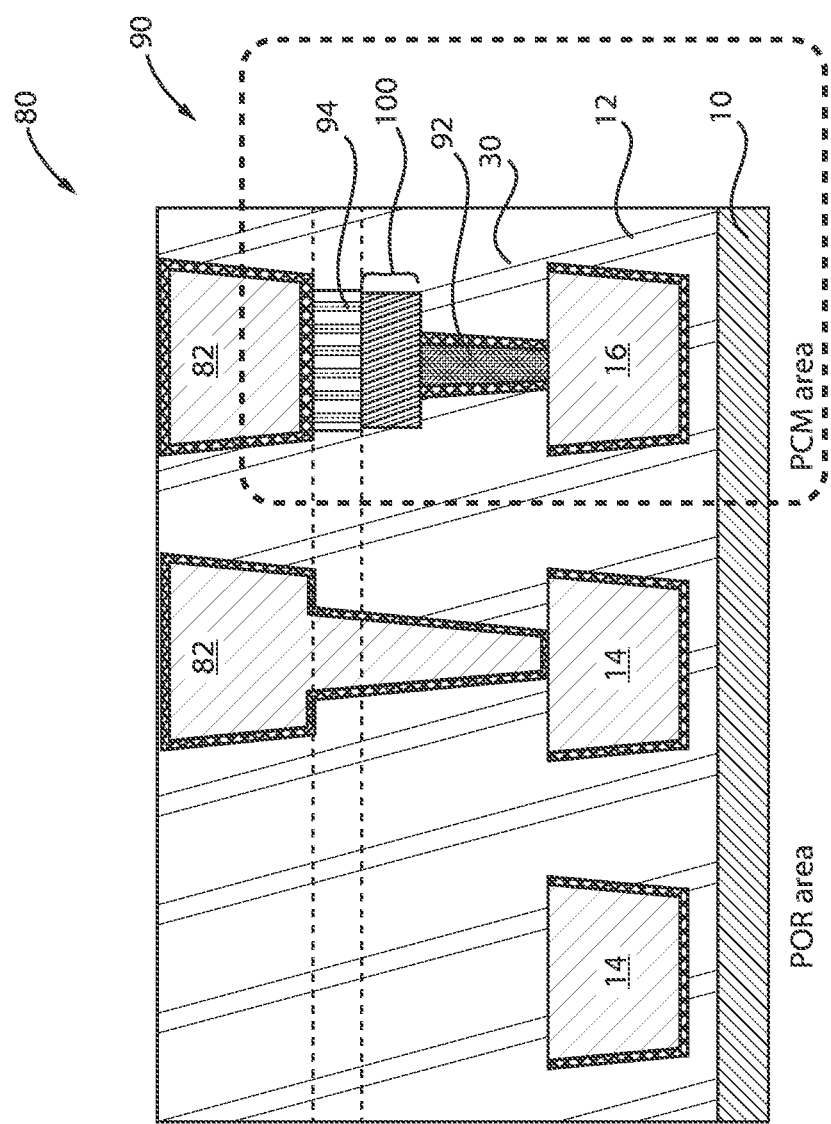
FIG. 7 is a cross-sectional view of the semiconductor structure including a phase change material stack between top and bottom electrodes, in accordance with another embodiment of the present invention.

FIG. 7 is a cross-sectional view of the semiconductor structure including a phase change material stack between top and bottom electrodes, in accordance with another embodiment of the present invention.

In various example embodiments, in structure 80, a bottom electrode 92 can be formed over metal line 16. A PCM cell structure 100 can be formed over bottom electrode 92. A top electrode 94 is formed over PCM cell structure 100. Contacts 82 can be formed over the top electrode 94 and over one or more metal lines 14. The PCM area 90 will be further described below. The top electrode 94 can have a width of about 36 nm to about 56 nm. The top electrode 94 can have a thickness of about 25 nm.

Figure 8:
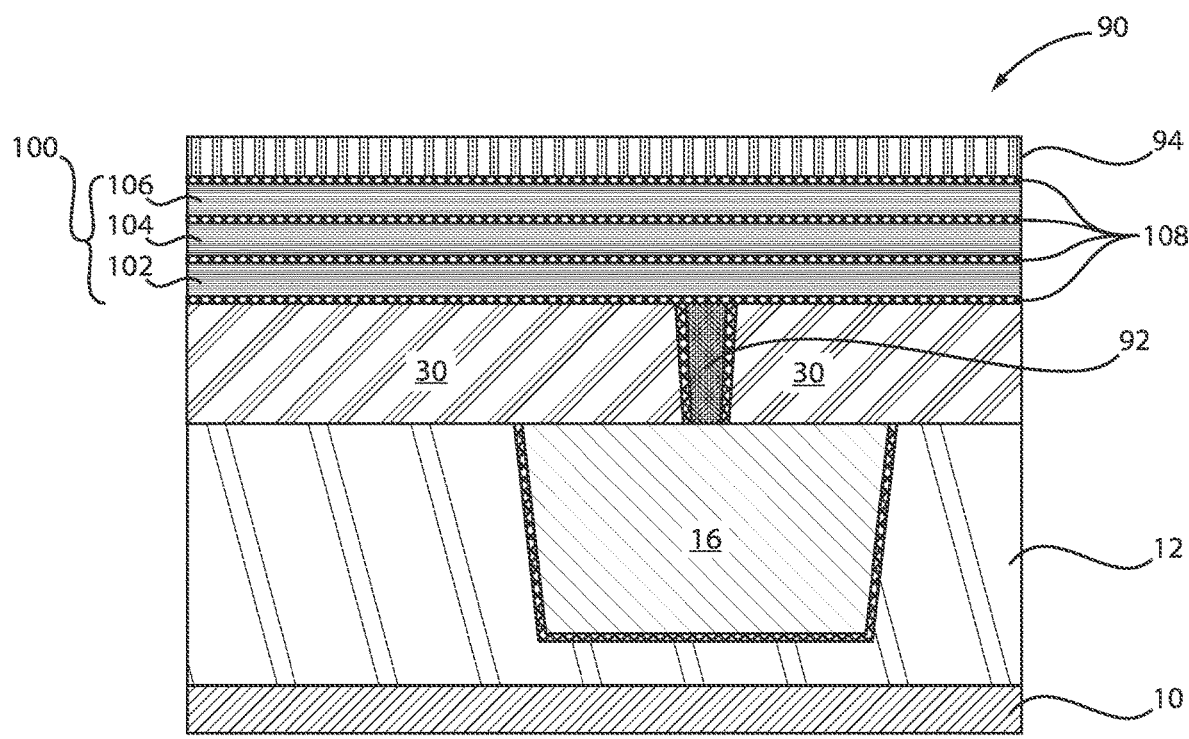
FIG. 8 is a cross-sectional view of the semiconductor structure of FIG. 7 illustrating the multiple layers of the phase change material stack, in accordance with an embodiment of the present invention.

FIG. 8 is a cross-sectional view of the semiconductor structure of FIG. 7 illustrating the multiple layers of the phase change material stack, in accordance with an embodiment of the present invention.

In various example embodiments, in structure 90, the PCM cell structure 100 includes a plurality of phase change material layers 102, 104, 106 separated by heat transfer layers 108. The bottom electrode 92 is perpendicular to the top electrode 94 and perpendicular to the PCM cell structure 100.

Figure 9:
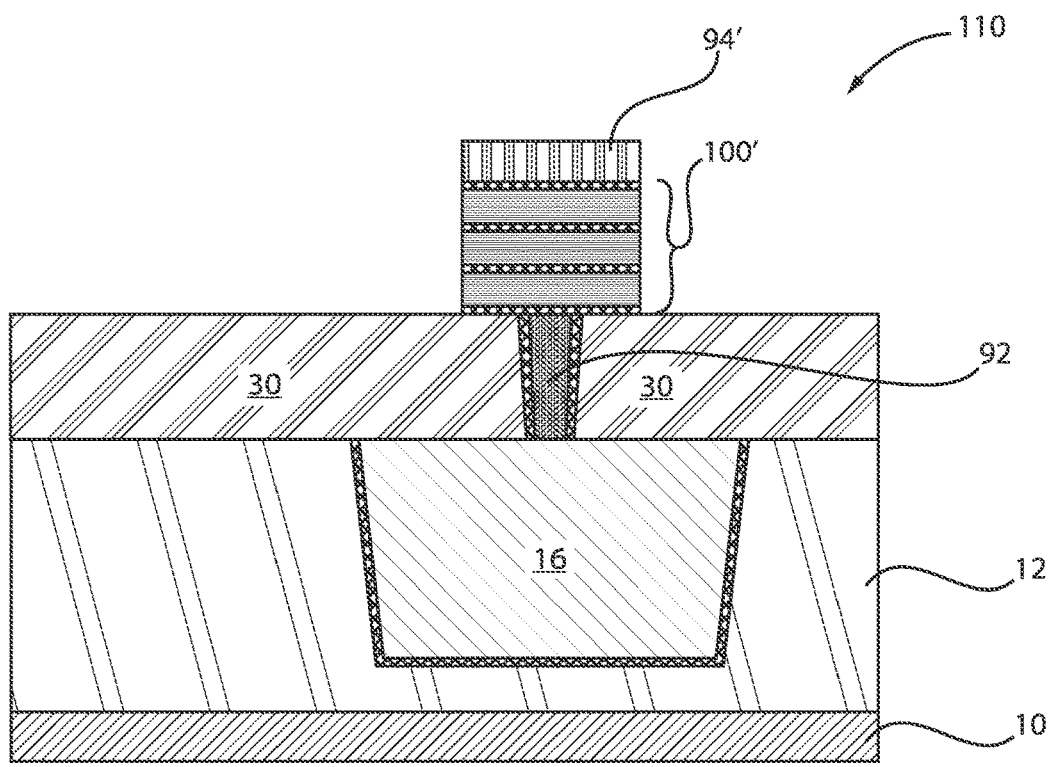
FIG. 9 is a cross-sectional view of the semiconductor structure of FIG. 8 where the phase change material stack is patterned and a liner is deposited, in accordance with an embodiment of the present invention.
Figure 9:
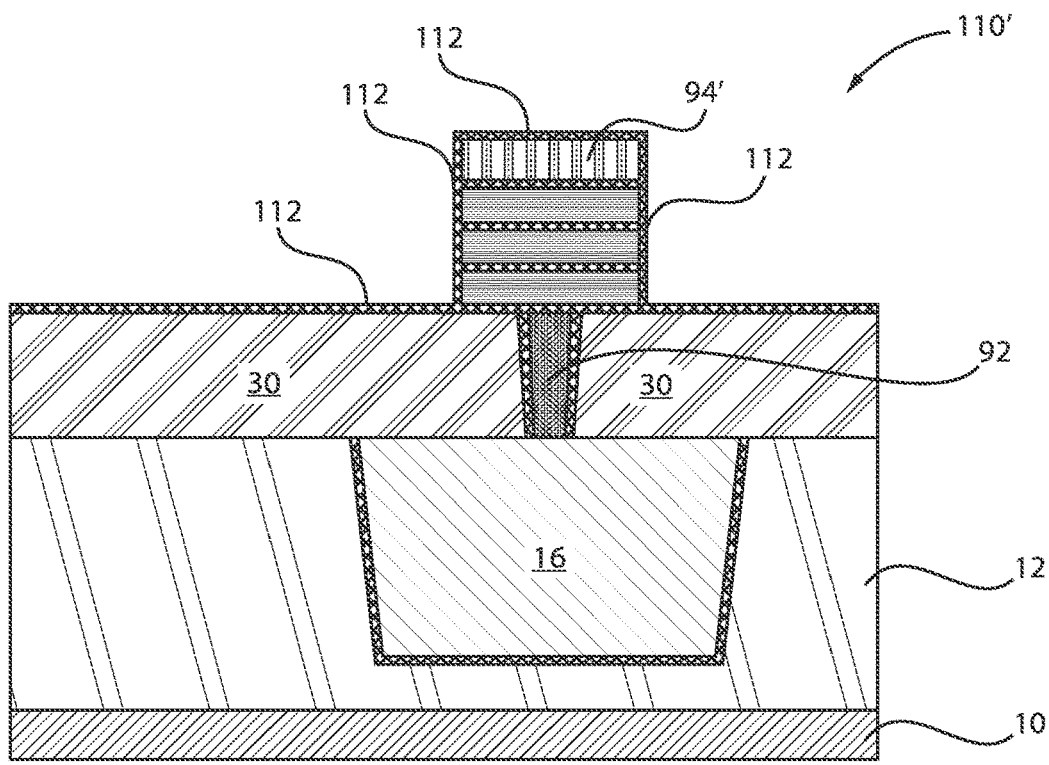

FIG. 9 is a cross-sectional view of the semiconductor structure of FIG. 8 where the phase change material stack is patterned and a liner is deposited, in accordance with an embodiment of the present invention.

In various example embodiments, in structure 110, the PCM cell structure 100 is patterned such that PCM cell stack 100' remains over the bottom electrode 92. The top electrode 94 is also etched to form top electrode portion 94'.

In various example embodiments, in structure 110', a liner 112 is deposited. The liner 112 directly contacts the top electrode portion 94', sidewalls of the PCM cell stack 100', and the top surface of the low-k dielectric layer 30. The liner 112 can be, e.g., TaN with different types of deposition such as PVD, CVD, ALD and with different resistance values. This material is not limited by other metal types such as TiN, W, or amorphous carbon (a-C), and dielectrics such as $Al_2O_3$, $HfO_2$, SiN, $ZrO_2$ etc.

Figure 10:
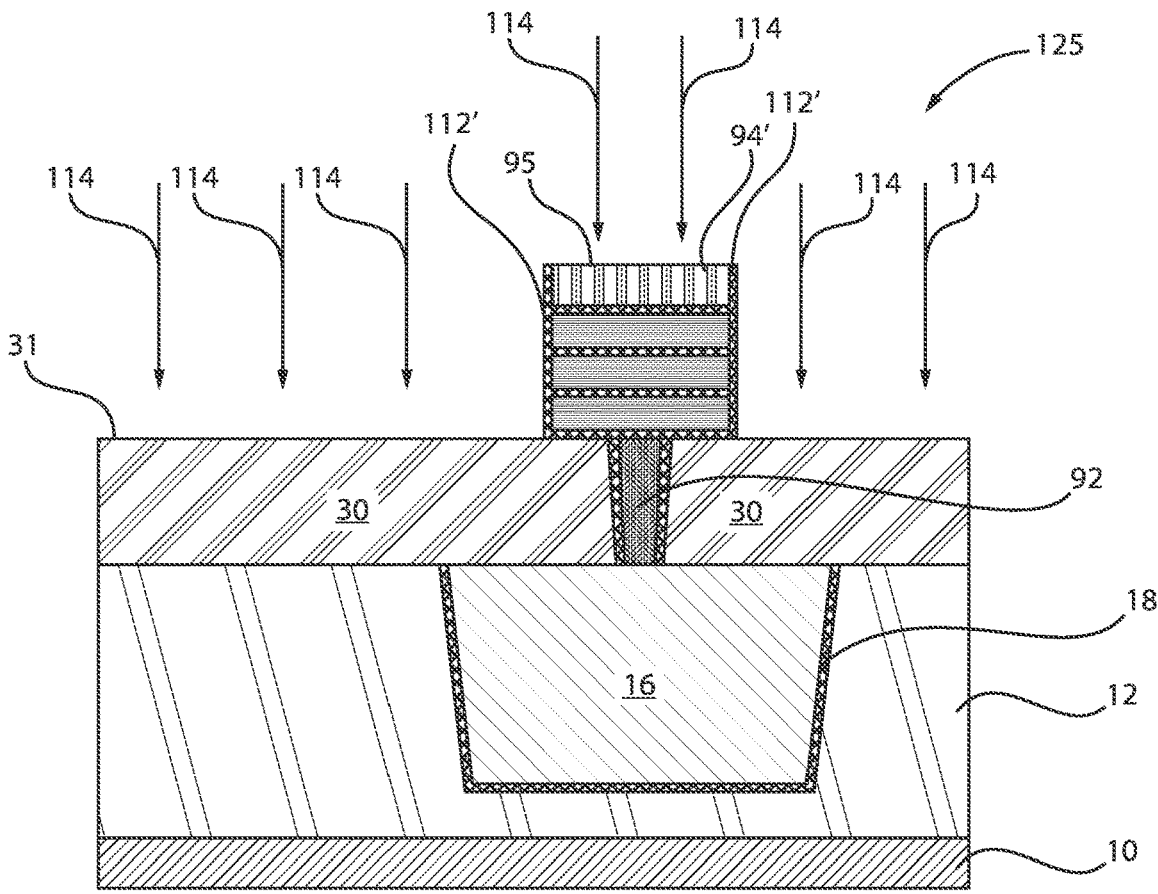
FIG. 10 is a cross-sectional view of the semiconductor structure of FIG. 9 where the liner is etched, a dielectric material is deposited, and a metal contact is formed over the top electrode of the patterned phase change material stack, in accordance with an embodiment of the present invention.
Figure 10:
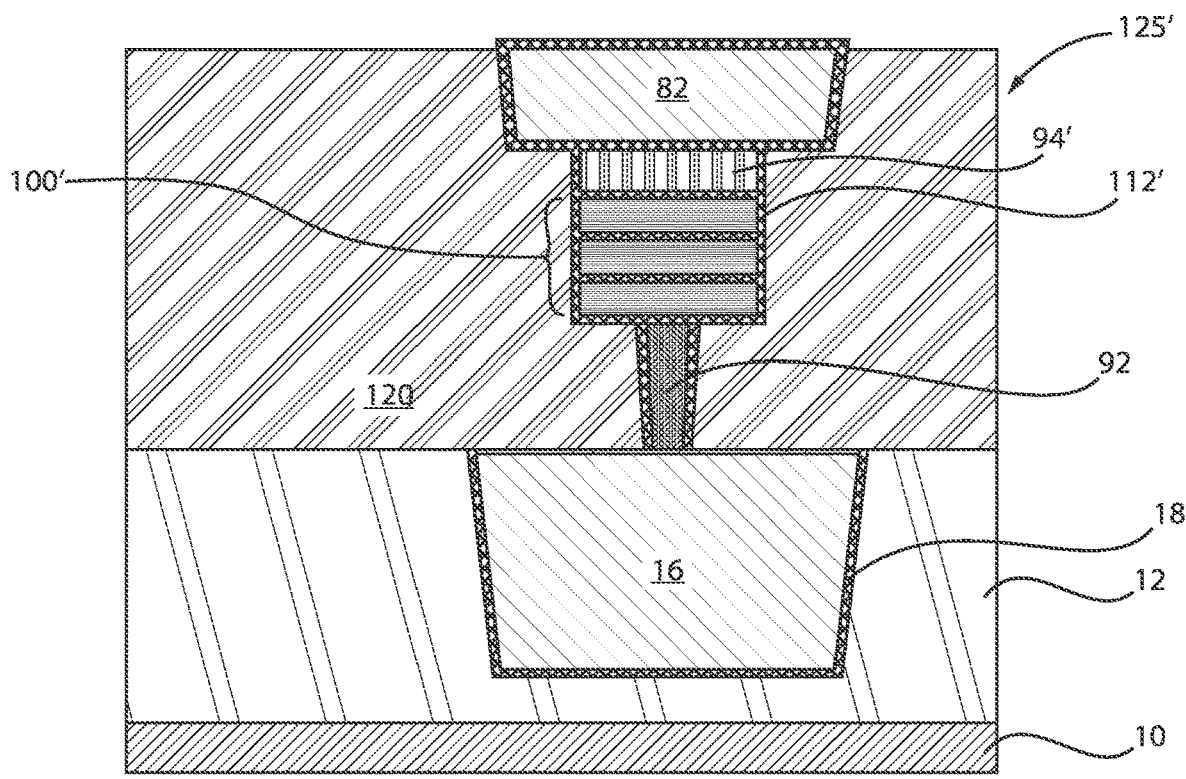

FIG. 10 is a cross-sectional view of the semiconductor structure of FIG. 9 where the liner is etched, a dielectric material is deposited, and a metal contact is formed over the top electrode of the patterned phase change material stack, in accordance with an embodiment of the present invention.

In various example embodiments, in structure 125, the liner 112 is etched via an etchant 114 such that a top surface 95 of top electrode portion 94' is exposed. Additionally, top surface 31 of low-k dielectric layer 30 is exposed. Liner portions or sections 112' remain adjacent and in direct contact to the sidewalls of the PCM cell stack 100'.

In various example embodiments, in structure 125', an ILD 120 is deposited, an opening is formed through the ILD 120 to the top surface of the top electrode portion 94', and the opening is filled with a conductive material 82.

In various example embodiments, the conductive material 82 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, CVD, PECVD, PVD, plating, thermal or e-beam evaporation, or sputtering.

In various exemplary embodiments, the height of the conductive material 82 can be reduced by CMP and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a phase change memory (PCM) cell employing multiple phase change layers and multiple heat conductors in an alternating configuration (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure for reducing a reset current for a phase change memory (PCM), the semiconductor structure comprising:
   a bottom electrode;
   a PCM cell structure disposed over the bottom electrode, the PCM cell structure including a plurality of phase change memory layers and a plurality of heat transfer layers, the heat transfer layers being metal liners, wherein the plurality of phase change memory layers are assembled in an alternating configuration with respect to the plurality of heat transfer layers, the plurality of phase change memory layers having different parallel lengths and an entirety of the phase change memory layers being perpendicular to a top surface of the bottom electrode; and
   a top electrode disposed over the PCM cell structure.

2. The semiconductor structure of claim 1, wherein the plurality of phase change memory layers each include a Ge—Sb—Te (germanium-antimony-tellurium or "GST") alloy.

3. The semiconductor structure of claim 1, wherein airgaps are defined adjacent the PCM cell structure.

4. The semiconductor structure of claim 3, wherein the airgaps extend from the top electrode to the bottom electrode.

5. The semiconductor structure of claim 1, wherein the PCM cell structure defines a U-shaped configuration.

6. The semiconductor structure of claim 5, wherein an oxide material is disposed within the U-shaped configuration.

7. The semiconductor structure of claim 6, wherein a pair of phase change memory layers are formed on one side of the oxide material and another pair of phase change memory layers are formed on an opposed side of the oxide material.

8. The semiconductor structure of claim 1, wherein the plurality of heat transfer layers directly contact a top surface of the bottom electrode.

9. The semiconductor structure of claim 1, wherein a first heat transfer layer of the plurality of heat transfer layers is in direct contact with a second heat transfer layer of the plurality of heat transfer layers and one of the plurality of phase change memory layers is arranged between the first and second heat transfer layers.

10. The semiconductor structure of claim 1, wherein the plurality of phase change memory layers are disposed in a straight line when viewed in a cross-section.

* * * * *